(12) United States Patent
Duan et al.

(10) Patent No.: US 11,435,400 B1
(45) Date of Patent: Sep. 6, 2022

(54) TEST COVERAGE RATE IMPROVEMENT SYSTEM FOR PINS OF TESTED CIRCUIT BOARD AND METHOD THEREOF

(71) Applicants: Inventec (Pudong) Technology Corporation, Shanghai (CN); Inventec Corporation, Taipei (TW)

(72) Inventors: Qiu-Yue Duan, Shanghai (CN); Ben Han, Shanghai (CN); Xin-Ying Xie, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 17/357,429

(22) Filed: Jun. 24, 2021

(30) Foreign Application Priority Data

Jun. 15, 2021 (CN) .......................... 202110661505.2

(51) Int. Cl.
| | |
|---|---|
| *G01R 31/3177* | (2006.01) |
| *G01R 31/317* | (2006.01) |
| *G01R 31/3187* | (2006.01) |
| *G01R 31/3185* | (2006.01) |
| *G01R 31/68* | (2020.01) |

(52) U.S. Cl.
CPC ..... *G01R 31/3177* (2013.01); *G01R 31/3187* (2013.01); *G01R 31/31713* (2013.01); *G01R 31/31717* (2013.01); *G01R 31/31855* (2013.01); *G01R 31/318508* (2013.01); *G01R 31/318533* (2013.01); *G01R 31/318597* (2013.01); *G01R 31/68* (2020.01)

(58) Field of Classification Search
CPC ........ G01R 31/3177; G01R 31/318508; G01R 31/318533; G01R 31/31855; G01R 31/318597; G01R 31/31717; G01R 31/31713; G01R 31/68; G01R 31/3187

USPC .......................................... 714/727, 726, 729
See application file for complete search history.

(56) References Cited

U.S. PATENT DOCUMENTS

| | | | | |
|---|---|---|---|---|
| 2002/0062461 | A1* | 5/2002 | Nee ........................ | G06F 11/261 714/28 |
| 2006/0025013 | A1* | 2/2006 | Baba .................... | H05K 1/0268 439/557 |

(Continued)

FOREIGN PATENT DOCUMENTS

CN 109901046 A * 6/2019

*Primary Examiner* — John J Tabone, Jr.
(74) *Attorney, Agent, or Firm* — David R. Stevens; Stevens Law Group

(57) ABSTRACT

A test coverage rate improvement system for pins of tested circuit board and a method thereof are disclosed. In the system, partial pins of a circuit board connector in a tested circuit board are not electrically connected to the boundary scan chip, test pins of the test pin board are pressed with the partial pins by a fixture of a boundary scan interconnect testing workstation to electrically connect the test pins to the partial pins. A test access port controller receives a detection signal for detecting the partial pins, which are not electrically connected to the boundary scan chip, of the circuit board connector through the test pin board from the test adapter card, and determines whether conduction is formed based on the detection signal, thereby achieving the technical effect of improving a test coverage rate for the pins of the tested circuit board.

8 Claims, 4 Drawing Sheets

(56) References Cited

U.S. PATENT DOCUMENTS

| | | | |
|---|---|---|---|
| 2009/0182523 A1* | 7/2009 | Nakano | G01R 31/318572 702/120 |
| 2014/0058699 A1* | 2/2014 | Okamoto | G01R 31/31908 702/118 |
| 2017/0184670 A1* | 6/2017 | Song | G06F 11/273 |
| 2017/0184671 A1* | 6/2017 | Song | G01R 31/3177 |
| 2018/0156868 A1* | 6/2018 | Batz | G01R 31/31701 |
| 2019/0178936 A1* | 6/2019 | Mu | G01R 31/68 |
| 2020/0132768 A1* | 4/2020 | Sang | G01R 31/318572 |
| 2021/0389368 A1* | 12/2021 | Zhang | G01R 31/2815 |

* cited by examiner

TEST COVERAGE RATE IMPROVEMENT SYSTEM FOR PINS OF TESTED CIRCUIT BOARD AND METHOD THEREOF

CROSS-REFERENCE TO RELATED APPLICATION

This application claims the benefit of Chinese Application Serial No. 202110661505.2, filed Jun. 15, 2021, which is hereby incorporated herein by reference in its entirety.

BACKGROUND OF THE INVENTION

Field of the Invention

The present invention is related to a test system and a method thereof. More particularly, the present invention is related to a test coverage rate improvement system for pins of tested circuit board; and in the test coverage rate improvement system, a test access port (TAP) controller receives a detection signal for detecting partial pins, not electrically connected to a boundary scan chip, of a circuit board connector through a test pin board and determines whether conduction is formed based on the detection signal; and the present invention is related to a method thereof.

Description of the Related Art

A conventional boundary scan interconnect testing workstation can test boundary scan components of a tested circuit board, and a boundary scan chain established by the boundary scan detection program can be used to realize the data analysis and processing in the boundary scan detection program, and finally form criterion for fault in a pin interconnect status.

The conventional boundary scan interconnect testing workstation tests interconnection between connectors and a boundary scan chip on the tested circuit board, so as to detect structural faults, such as faults, short circuits, open circuits, etc.

The core technology of the conventional boundary scan interconnect testing workstation is to use the boundary scan test technology. The boundary scan test technology requires the boundary scan chips, each of which has a controllable cell, at both ends of the tested circuit; however, in a condition that no boundary scan chip is disposed on an end of the tested circuit or the boundary scan chip does not have the cell, the above-mentioned test cannot be performed according to the existing boundary scan test technology.

Therefore, what is needed is to develop an improved technical solution to solve the above-mentioned problem that the conventional boundary scan test for the tested circuit board is unable to cover all pins of the tested circuit board.

SUMMARY OF THE INVENTION

In order to solve the conventional problem that the conventional boundary scan test for the tested circuit board is unable to cover all pins of the tested circuit board, the present invention provides a test coverage rate improvement system for pins of tested circuit board and a method thereof, and the test coverage rate improvement system is adapted to a detecting operation of a boundary scan interconnect testing workstation and includes a tested circuit board, a test adapter card, a test pin board and a test access port (TAP) controller.

The tested circuit board includes at least one boundary scan chip and at least one circuit board connector, and partial pins of the at least one circuit board connector are not electrically connected to the at least one boundary scan chip. The test adapter card includes an adapter connector, an adapter pin-board connector and an adapter TAP connector, and the adapter connector is electrically connected to corresponding one of the at least one circuit board connector. The test pin board includes test pins and a pin board connector, and the test pins correspond in position to the partial pins, not electrically connected to the boundary scan chip, of the at least one circuit board connector respectively, and the test pins are electrically connected to the partial pins of the circuit board connector, respectively, by being pressed by a fixture of the boundary scan interconnect testing workstation, and the pin board connector is electrically connected to the adapter pin-board connector. The TAP controller is electrically connected to the adapter TAP connector through a controller connector, and configured to receive a detection signal for detecting the partial pins of the circuit board connector through the test pin board from the test adapter card, and determine whether conduction is formed based on the detection.

According to an embodiment, the present invention further provides a test coverage rate improvement method for pins of tested circuit board, and the test coverage rate improvement method is adapted to a detecting operation of a boundary scan interconnect testing workstation and includes steps of: providing a tested circuit board comprising at least one boundary scan chip and at least one circuit board connector; not electrically connecting partial pins of the circuit board connector of the tested circuit board to the boundary scan chip; providing a test adapter card comprising an adapter connector, an adapter pin-board connector and an adapter TAP connector; electrically connecting the test adapter card to the corresponding one of the at least one circuit board connector through the adapter connector; providing a test pin board comprising test pins and a pin board connector; corresponding the test pins in position to the partial pins, which are not electrically connected to the boundary scan chip, of the circuit board connector, respectively; using a fixture of the boundary scan interconnect testing workstation to press the test pins with the partial pins of the circuit board connector, to electrically connect the test pins to the partial pins of the circuit board connector; electrically connecting the test pins to the adapter pin-board connector through a pin board connector; providing a TAP controller comprising a controller connector; electrically connecting the TAP controller to the adapter TAP connector through the controller connector; and using the TAP controller to receive a detection signal for detecting the partial pins, which are not electrically connected to the boundary scan chip, of the circuit board connector through the test pin board from the test adapter card, and determine whether conduction is formed based on the detection signal.

According to above-mentioned contents of the system and method of the present invention, the difference between the present invention and the conventional technology is that, in the system of the present invention, the partial pins of the circuit board connector of the tested circuit board are not electrically connected to the boundary scan chip, the test pins of the test pin board are pressed with the partial pins by the fixture of the boundary scan interconnect testing workstation to electrically connect the test pins to the partial pins, the TAP controller receives the detection signal for detecting the partial pins, which are not electrically connected to the boundary scan chip, of the circuit board connector through the test pin board from the test adapter card, and determines whether conduction is formed based on the detection signal.

According to the above-mentioned contents, the present invention can achieve the technical effect of improving the test coverage rate for the pins of the tested circuit board.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
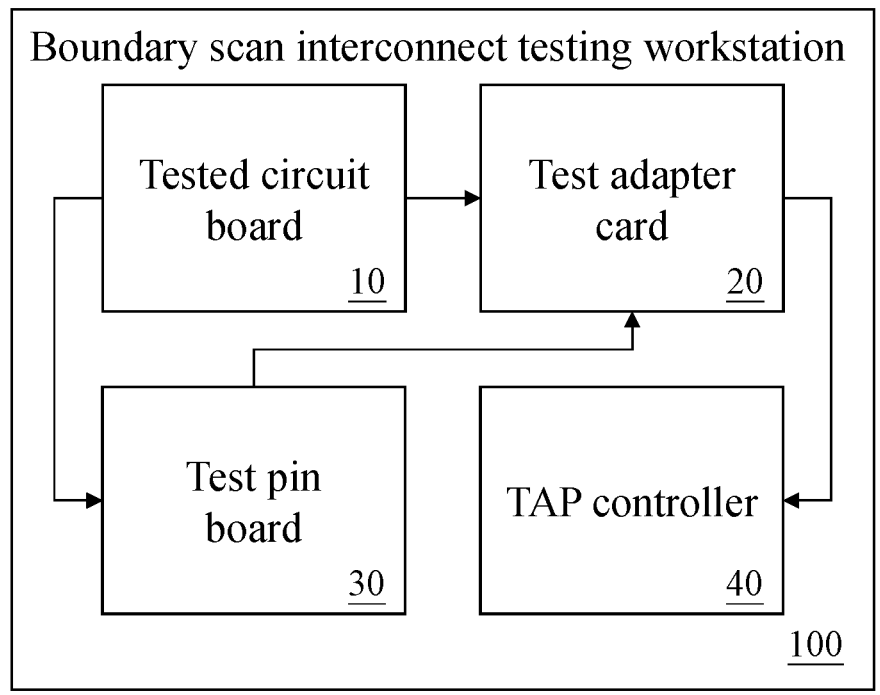
FIG. 1 is a system block view of a test coverage rate improvement system for pins of a tested circuit board, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The test coverage rate improvement system of the present invention will be described in the following paragraphs first. Please refer to FIG. 1, which is a system block diagram of a test coverage rate improvement system for pins of tested circuit board, according to the present invention.

The test coverage rate improvement system of the present invention is adapted to a detecting operation of a boundary scan interconnect testing workstation 100 and includes a tested circuit board 10, a test adapter card 20, a test pin board 30, and a TAP controller 40.

Figure 2:
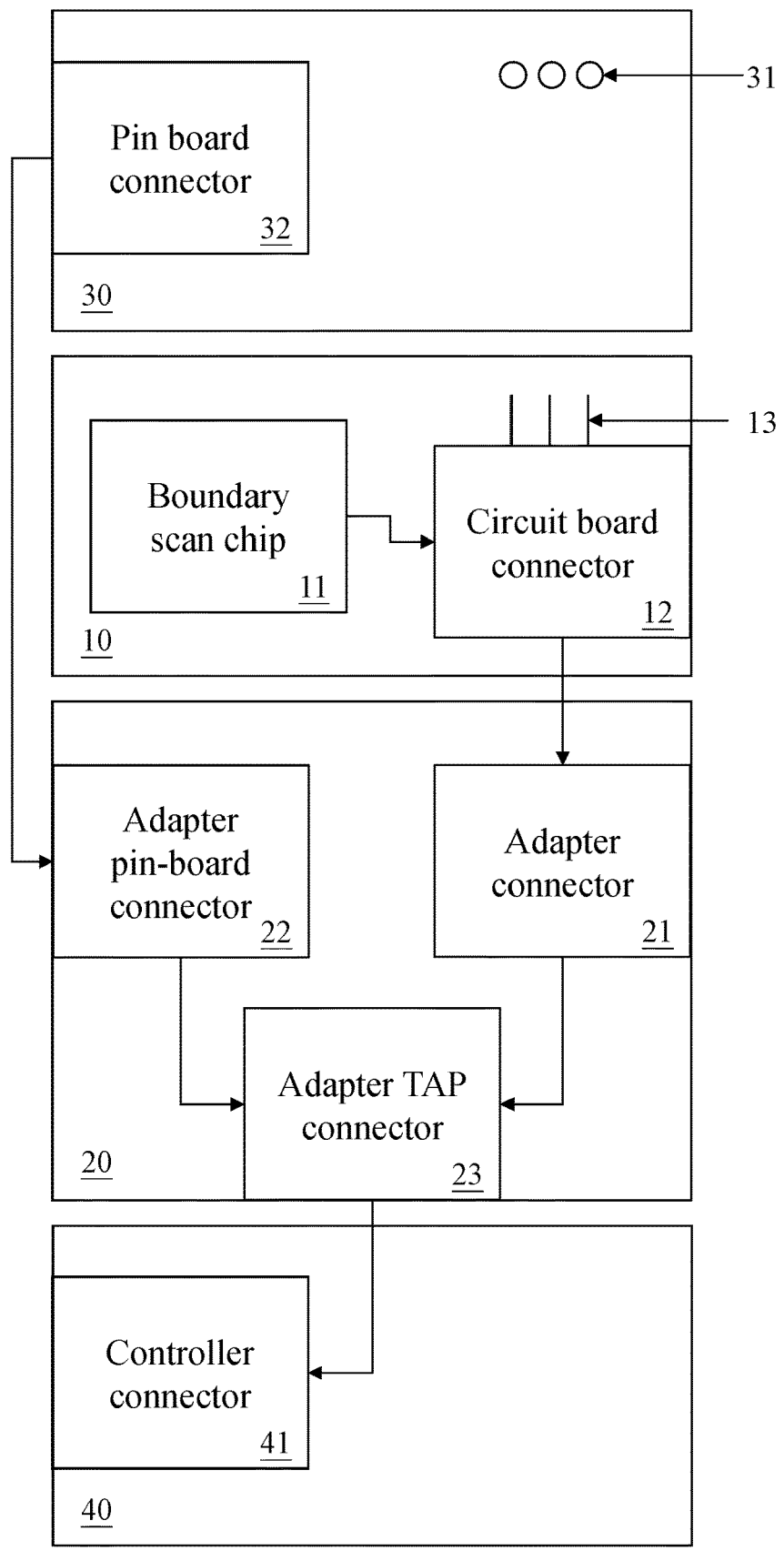
FIG. 2 is a schematic view a connection structure of a test coverage rate improvement system for pins of a tested circuit board, according to the present invention.

Please refer to FIG. 2, which is a schematic view of a connection structure of the test coverage rate improvement system of the present invention.

The tested circuit board 10 includes at least one boundary scan chip 11 and at least one circuit board connector 12, and partial pins 13 of the at least one circuit board connector 12 are not electrically connected to the boundary scan chip 11, and the remaining pins of the at least one circuit board connector 12 are electrically connected to the boundary scan chip 11. It should be noted that, the partial pins 13, not electrically connected to the boundary scan chip 11, of the circuit board connector 12 can include a power pin and a ground pin, but these examples are merely for exemplary illustration, and the application field of the present invention is not limited thereto. In an embodiment, the circuit board connector 12 can be, for example, PCI-E, DIMM, USB, RS-232, JTAG, and a cable connector and so on, but these examples are merely for exemplary illustration, and the application field of the present invention is not limited thereto.

The test adapter card 20 can include an adapter connector 21, an adapter pin-board connector 22, and an adapter TAP connector 23. The test adapter card 20 can make the adapter connector 21 electrically connect to the corresponding one of the at least one circuit board connector 12 through a plugging manner, a connection line or a cable. The adapter connector 21 and the circuit board connector 12 can be the connectors corresponding to each other; for example, the adapter pin-board connector 22 can be PCI-E, DIMM, USB, RS-232, JTAG, or cable connector, and the adapter TAP connector 23 can be USB or RS-232, but these examples are merely for exemplary illustration, and the application field of the present invention is not limited thereto.

The test pin board 30 includes test pins 31 and a pin board connector 32, and the test pin 31 of the test pin board 30 correspond in position to the partial pins 13, not electrically connected to the boundary scan chip 11, of the circuit board connector 12, respectively; that is, for different models of the tested circuit boards 10, the configuration positions of the test pins 31 in the test pin boards 30 can be different, partially the same or fully the same. In an embodiment, the pin board connector 32 of the test pin board 30 and the adapter pin-board connector 22 can be the connectors corresponding to each other, but these examples are merely for exemplary illustration, and the application field of the present invention is not limited thereto.

After the boundary scan interconnect testing workstation 100 selects the test pin board 30 corresponding to the tested circuit board 10, the boundary scan interconnect testing workstation 100 can use a fixture to press the test pin 31 of the test pin board 30 with the partial pins 13 of the circuit board connector 12 in the tested circuit board 10, respectively, so as to electrically connect the test pins 31 of the test pin board 30 to the partial pins 13 of the circuit board connector 12, respectively.

The test pin board 30 makes the pin board connector 32 electrically connect to the adapter pin-board connector 22 through a plugging manner, a connection line or a cable, so that the test adapter card 20 can receive electrical signals of the partial pins 13 of the circuit board connector 12 from the test pin board 30, and the test adapter card 20 can convert the electrical signals of the partial pins 13 of the circuit board connector 12 received from the test pin board 30 into a detection signal for detecting the partial pins 13 of the circuit board connector 12.

The controller connector 41 of the TAP controller 40 and the adapter TAP connector 23 can be the connectors corresponding to each other, and the controller connector 41 of the TAP controller 40 can be electrically connected to the adapter TAP connector 23 through a plugging manner, a connection line, or a cable.

The TAP controller 40 receives the detection signal for detecting the partial pins 13 of the circuit board connector 12 from the test adapter card 20, and the TAP controller 40 can determine whether conduction is formed based on the detection signal.

Figure 3A:
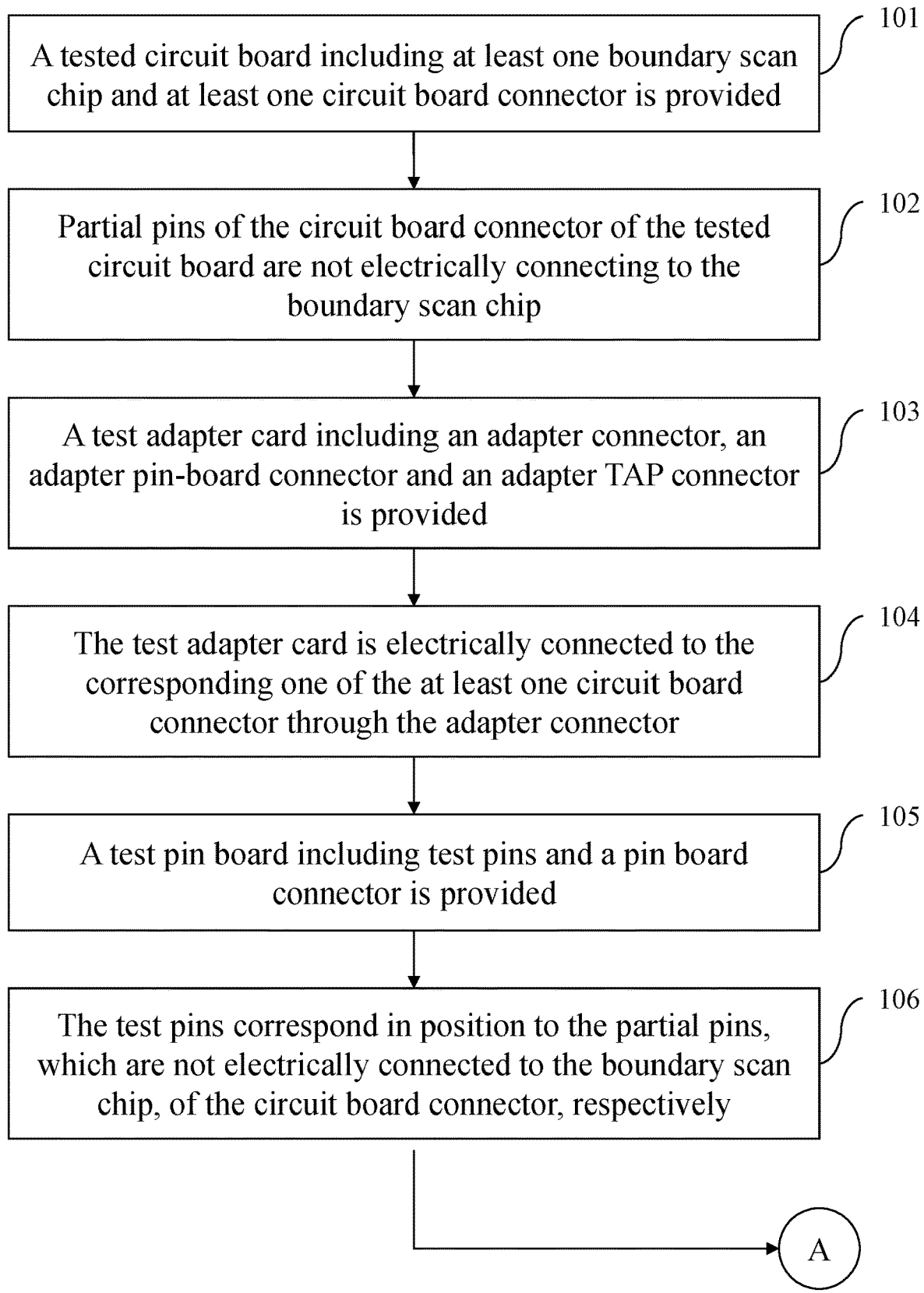
FIGS. 3A and 3B are flowcharts of a test coverage rate improvement method for pins of tested circuit board, according to the present invention.
Figure 3B:
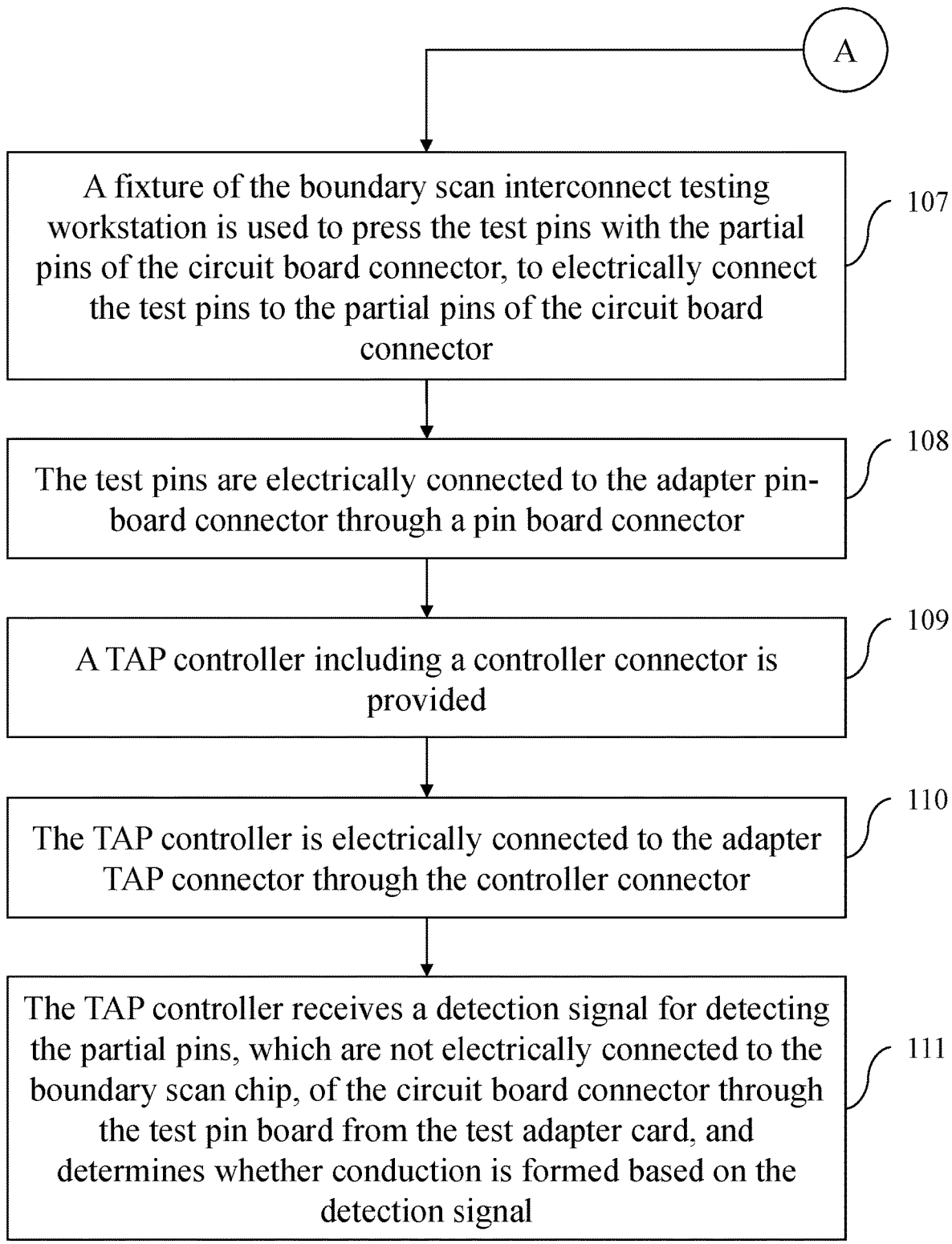

The operational method of the present invention will be described in the following paragraphs in reference with FIGS. 3A and 3B. FIGS. 3A and 3B are flowcharts of a test coverage rate improvement method for pins of tested circuit board, according to the present invention.

The test coverage rate improvement method includes the following steps. In a step 101, a tested circuit board including at least one boundary scan chip and at least one circuit board connector is provided. In a step 102, partial pins of the circuit board connector of the tested circuit board are not electrically connecting to the boundary scan chip. In a step 103, a test adapter card including an adapter connector, an adapter pin-board connector and an adapter TAP connector is provided. In a step 104, the test adapter card is electrically connected to the corresponding one of the at least one circuit board connector through the adapter connector. In a step 105, a test pin board including test pins and a pin board connector is provided; in a step 106, the test pins correspond in position to the partial pins, which are not electrically connected to the boundary scan chip, of the circuit board connector, respectively. In a step 107, a fixture of the boundary scan interconnect testing workstation is used to press the test pins with the partial pins of the circuit board connector, to electrically connect the test pins to the partial pins of the circuit board connector. In a step 108, the test pins are electrically connected to the adapter pin-board connector through a pin board connector. In a step 109, a TAP controller including a controller connector is provided. In a step 110, the TAP controller is electrically connected to the adapter TAP connector through the controller connector. In a step 111, the TAP controller receives a detection signal for detecting the partial pins, which are not electrically connected to the boundary scan chip, of the circuit board connector through the test pin board from the test adapter card, and determines whether conduction is formed based on the detection signal.

According to above-mentioned contents, the difference between the present invention and the conventional technology is that, in the present invention, the partial pins of the circuit board connector in the tested circuit board are not electrically connected to the boundary scan chip, the test pins of the test pin board can be pressed with the partial pins by the fixture of the boundary scan interconnect testing workstation to electrically connect the test pins to the partial pins, and the TAP controller receives a detection signal for detecting the partial pins, which are not electrically connected to the boundary scan chip, of the circuit board connector through the test pin board from the test adapter card, and determines whether conduction is formed based on the detection signal.

According to the above-mentioned technical solution, the present invention can solve the conventional problem that the conventional boundary scan test for the tested circuit board is unable to cover all pins of the tested circuit board, so as to achieve the technical effect of improving a test coverage rate for the pins of the tested circuit board.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A test coverage rate improvement system for pins of a tested circuit board, adapted to a detecting operation of a boundary scan interconnect testing workstation, comprising:
   a tested circuit board comprising at least one boundary scan chip and at least one circuit board connector, wherein partial pins of the at least one circuit board connector are not electrically connected to the at least one boundary scan chip;
   a test adapter card comprising an adapter connector, an adapter pin-board connector and an adapter TAP connector, wherein the adapter connector is electrically connected to corresponding one of the at least one circuit board connector;
   a test pin board comprising test pins and a pin board connector, wherein the test pins correspond in position to the partial pins, not electrically connected to the boundary scan chip, of the at least one circuit board connector respectively, and the test pins are electrically connected to the partial pins of the circuit board connector, respectively, by being pressed by a fixture of the boundary scan interconnect testing workstation, and the pin board connector is electrically connected to the adapter pin-board connector; and
   a TAP controller electrically connected to the adapter TAP connector through a controller connector, and configured to receive a detection signal for detecting the partial pins of the circuit board connector through the test pin board from the test adapter card, and determine whether conduction is formed based on the detection.

2. The test coverage rate improvement system for pins of tested circuit board according to claim 1, wherein the partial pins, which are not electrical connected to the boundary scan chip, of the at least one circuit board connector comprise a power pin and a ground pin.

3. The test coverage rate improvement system for pins of tested circuit board according to claim 1, wherein the test adapter card receives electrical signals of the partial pins of the circuit board connector from the test pin board, and converts the received electrical signals of the partial pins of the circuit board connector into the detection signal.

4. The test coverage rate improvement system for pins of tested circuit board according to claim 1, wherein the boundary scan interconnect testing workstation selects the test pin board corresponding to the tested circuit board, and a fixture of the boundary scan interconnect testing workstation is used to press the test pins with the partial pins of the circuit board connector to electrically connect the test pins to the partial pins of the circuit board connector, respectively.

5. A test coverage rate improvement method for pins of tested circuit board, adapted to a detecting operation of a boundary scan interconnect testing workstation, comprising:
   providing a tested circuit board comprising at least one boundary scan chip and at least one circuit board connector;
   not electrically connecting partial pins of the circuit board connector of the tested circuit board to the boundary scan chip;

providing a test adapter card comprising an adapter connector, an adapter pin-board connector and an adapter TAP connector;

electrically connecting the test adapter card to the corresponding one of the at least one circuit board connector through the adapter connector;

providing a test pin board comprising test pins and a pin board connector;

corresponding the test pins in position to the partial pins, which are not electrically connected to the boundary scan chip, of the circuit board connector, respectively;

using a fixture of the boundary scan interconnect testing workstation to press the test pins with the partial pins of the circuit board connector, to electrically connect the test pins to the partial pins of the circuit board connector;

electrically connecting the test pins to the adapter pin-board connector through a pin board connector;

providing a TAP controller comprising a controller connector;

electrically connecting the TAP controller to the adapter TAP connector through the controller connector; and using the TAP controller to receive a detection signal for detecting the partial pins, which are not electrically connected to the boundary scan chip, of the circuit board connector through the test pin board from the test adapter card, and determine whether conduction is formed based on the detection signal.

6. The test coverage rate improvement method for pins of tested circuit board according to claim 5, wherein the partial pins, which are not electrical connected to the boundary scan chip, of the at least one circuit board connector comprise a power pin and a ground pin.

7. The test coverage rate improvement method for pins of tested circuit board according to claim 5, wherein the step of using the TAP controller to receive the detection signal for detecting the partial pins, which are not electrically connected to the boundary scan chip, of the circuit board connector through the test pin board from the test adapter card and determine whether conduction is formed based on the detection signal, comprises:

using the test adapter card receives electrical signals of the partial pins of the circuit board connector from the test pin board, and converting the received electrical signals of the partial pins of the circuit board connector into the detection signal.

8. The test coverage rate improvement method for pins of tested circuit board according to claim 5, wherein the step of using the fixture of the boundary scan interconnect testing workstation to press the test pins with the partial pins of the circuit board connector to make the test pins electrically connect to the partial pins of the circuit board connector, comprises:

selecting the test pin board corresponding to the tested circuit board in the boundary scan interconnect testing workstation;

using a fixture of the boundary scan interconnect testing workstation to press the test pins with the partial pins of the circuit board connector to electrically connect the test pins to the partial pins of the circuit board connector, respectively.

\* \* \* \* \*